July 5, 1966 R. R. LINDSTRAND 3,259,813

TRANSISTOR HEAT SINK

Filed April 5, 1962

INVENTOR:
Robert R. Lindstrand

By Richard [signature]
Agent

United States Patent Office 3,259,813
Patented July 5, 1966

3,259,813
TRANSISTOR HEAT SINK

Robert R. Lindstrand, Los Angeles, Calif., assignor to Litton Precision Products, Inc., Beverly Hills, Calif., a corporation of Delaware Filed Apr. 5, 1962, Ser. No. 185,388
3 Claims. (Cl. 317—234)

The present invention relates to heat-dissipating component mountings and, more particularly, to heat sinks for transistors, useful in connection with forced convection air-cooling systems.

It is a well known fact that transistors, when in operation, develop quantities of heat resulting in temperatures which frequently are not compatible with flawless performance of the circuit or device of which they form part. For this reason, a great number of remedies has been suggested such as the provision of metallic supports having cooling fins, or arrangements favoring heat dissipation by connection through metallic parts of the supporting structure. The efficiency of most solutions to the problem therefore depends on the availability of both metallic parts for conducting heat away from the transistor, and space for cooling fins which, by their nature, are space-consuming without otherwise contributing to the assembly or the circuit.

In a great number of circuit arrangements, the components including one or generally a number of transistors are mounted on panels, frequently printed or etched circuit boards. These panels or boards are made of electrically insulating material and therefore are heat insulators so that they are not suitable to dissipate the heat developed by the transistors. Consequently, supporting structures with cooling fins or other means for conducting heat away from the transistors have been proposed, especially in connection with printed circuit boards. However, printed circuit boards are preferably used in compact circuit assemblies having severe restrictions on available space. In prior art arrangements, therefore, the advantage obtained by the use of such boards is lost by the fact that space-consuming cooling elements must be used and mounted on the circuit board, in close heat-transferring proximity with each transistor. In many instances, the cooling fin structure occupies a multiple of the volume of the transistor.

Accordingly, it is one of the more important objects of the present invention to improve the dissipation of heat away from transistors.

Other objects of this invention include the provision of a space-saving transistor heat sink and increasing the efficiency of forced air transistor cooling arrangements, especially in connection with the use of printed or etched circuit boards.

In many other prior art arrangements, where no heat dissipating structure is provided, the transistor leads are soldered or welded directly to the printed circuit board. Under conditions of severe shock or vibration the transistor will act like a pendulum, vibrating back and forth until its leads break. This problem may be obviated by incapsulation of the entire unit, but this is at the expense of component interchangeability.

Accordingly, another object of the present invention is to provide a simple shock-resistant transistor mounting structure which also provides good heat dissipation.

In accordance with one of the more important features of the present invention, a heat-dissipating component mounting includes an openwork receptacle adapted for assembly with a transistor, and specific supporting structure for securing the receptacle-transistor assembly to a wall or panel such as a printed circuit board in such a manner that the receptacle is maintained spaced from the panel so that all free assembly surfaces are exposed.

When used in connection with a cooling airflow, a maximum heat exchange between the cooling air and the transistor is accomplished because the assembly protrudes entirely into the space adjacent the panel and none of the hot surfaces is blocked from contact with the coolant. "Hot spots" which are usually present where the component engages the insulating circuit board are therefore eliminated.

In accordance with another feature of the invention, the receptacle for supporting a transistor is provided with a pair of legs or prongs extending through apertures in the panel, for example the printed circuit board, each leg having clips which resiliently cooperate with the circuit board and thereby maintain the receptacle in a position to completely protrude into the adjacent space.

Additional features include clips formed by a pair of parallel longitudinal cuts in the legs interconnected by a centrally located cross cut to form a pair of resilient tongues bent away from the plane of the leg, and a receptacle for the transistor having axial slots and an aperture in the bottom to improve heat exchange with the coolant.

The novel features which are believed to be characteristic of the invention, both as to its organization and method of construction and operation, together with further objects and advantages thereof, will be better understood from the following description considered in connection with the accompanying drawing in which two illustrative embodiments of the invention are disclosed, by way of example. It is to be expressly understood, however, that the drawing is for the purpose of illustration and description only and does not constitute a limitation of the invention.

In the drawing.

Identical elements are designated by the same reference numerals throughout the several views of the drawing.

Figure 1:
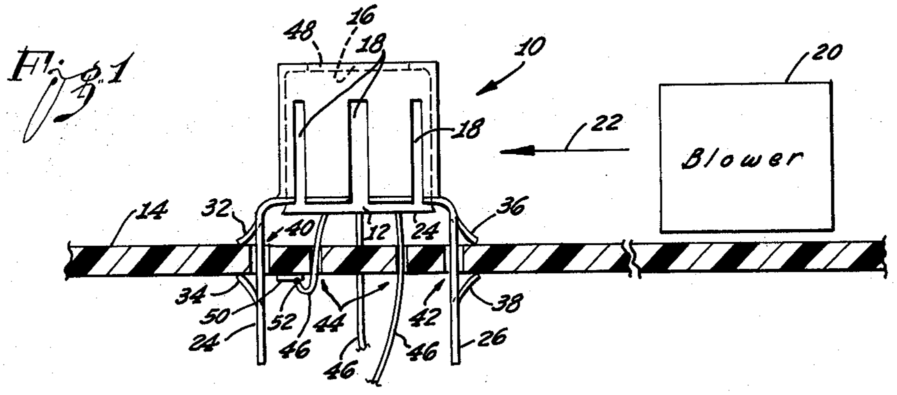
FIG. 1 is an elevational view of one embodiment of a transistor heat sink in accordance with the invention.
Figure 2:
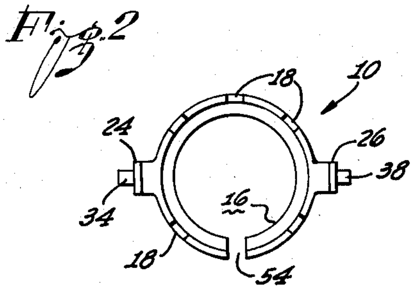
FIG. 2 is a bottom view of FIG. 1.
Figure 3:
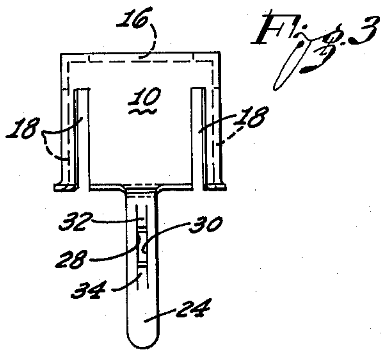
FIG. 3 is a side view of FIG. 1.

The embodiment of a transistor heat sink illustrated in FIGS. 1–3 includes a receptacle, designated by reference numeral 10, shaped to receive a transistor 12 and mounted on a suitable base 14, such as a panel or printed circuit board. Both the panel and the transistor are omitted in FIGS. 2 and 3, for the sake of clarity and simplicity.

Referring particularly to the receptacle 10, this element suitably made of thin sheet metal supports the transistor 12 in a predetermined position. A comparatively large bottom aperture 16 and axially extending parallel slots 18 contribute to the resiliency of the generally cylindrical cup-shaped receptacle. In addition, the resulting openwork structure permits exposure of a comparatively extended surface area of transistor 12 to the ambient atmosphere. When used in connection with a forced convection air cooling system, symbolized by the block 20 representing a conventional blower or the like, all of the surfaces of the combined transistor-receptacle assembly are exposed to the coolant forced along the assembly in the direction of arrow 22. It should be noted, that this includes the transistor surface 24 known to be the hottest area of all transistor surfaces.

In accordance with the invention, and in order to support the receptacle 10 in a position away from the panel or circuit board 14, a pair of prongs or legs 24 and 26 are provided to extend axially and parallel one with another from the receptacle 10, as best seen in FIGS. 1 and 3. Each of the legs has a pair of parallel longitudinal cuts made along lines 28 and 30 (FIG. 3), and a centrally-located cross-cut interconnects these longitudinal cuts in a slender H-configuration so that a pair of facing tongues are formed in each leg. The tongues are bent outwardly and assume the position shown in the drawing. Tongues 32 and 34 are those resulting from the cuts in leg 24, while the tongues pertaining to leg 26 are designated by reference numerals 36 and 38.

Each pair of tongues forms a clip adapted to resiliently engage an aperture in a panel. Referring specifically to FIG. 1, the circuit board 14 has a pair of smaller bores 40 and 42. When mounting the transistor heat sink on the circuit board, the legs 24 and 26 are introduced into the bores 40 and 42, respectively. The resilient tongues 34 and 38 are bent backward until the board 14 reaches the position shown in FIG. 1. Then, further motion is prevented by the stopping action of tongues 32 and 36, and tongues 34 and 38 snap back into their bent-away position to firmly grip the board edges. Now the transistor heat sink is secured in a position in which the receptacle 10 supporting the transistor 12 completely protrudes into the space adjacent the panel 14, with all hot surfaces exposed to the forced convection air flow supplied by blower 20.

It will be apparent that the location of the clip formed by the respective pairs of tongues 32, 34, and 36, 38, is selected in accordance with the size and shape of the assembly so that the distance measured between the clips and the transistor surface positioned away from the panel 14, which is surface 48 in FIG. 1, exceeds the length of the transistor. As a result, a gap is formed between the hottest transistor surface 24 and the panel 14, with coolant air having free access to surface 24. Consequently, the receptacle-transistor assembly is maintained spaced from the panel and all free assembly surfaces are exposed to the ambient atmosphere, which is suitably a forced convection coolant. The term "free assembly surfaces" refers to all exposed surfaces when considering the assembly as one unitary element.

Three additional openings 44, two of these openings being shown in FIG. 1, are suitably provided in panel 14 for passing the conventional three leads 46 to the other side of the panel.

In FIG. 1, and for the purpose of illustration, the left-hand lead 46 is shown connected to the flat conductor 50 bonded to the printed circuit board 14; the point of connection with the conductor 50 is designated by reference numeral 52. The other transistor leads may be connected to circuit board conductors in a similar manner.

It has been found convenient to form the entire transistor heat sink by punching out the development of the cylinder as one integral unit including the legs or prongs from sheet metal stock such as beryllium copper 0.008 inch thick and forming the cylindrical, cup-shaped receptacle from it by method steps well known in the sheet metal art. A further increase in resiliency of the receptacle is achieved by making the slotted strip forming the cylinder shorter than the cylinder circumference so that the facing edges do not join but leave a slot 54 between themselves.

Figure 4:
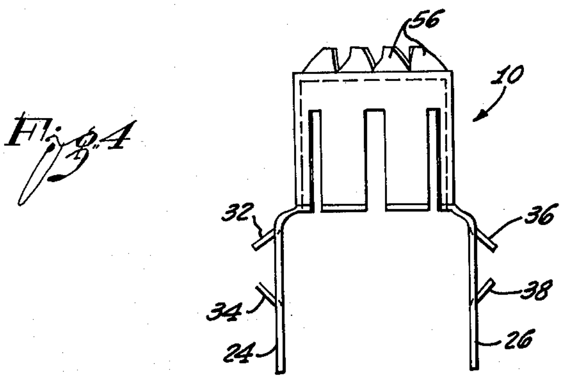
FIG. 4 is an elevational view of a modified embodiment of the invention.
Figure 5:
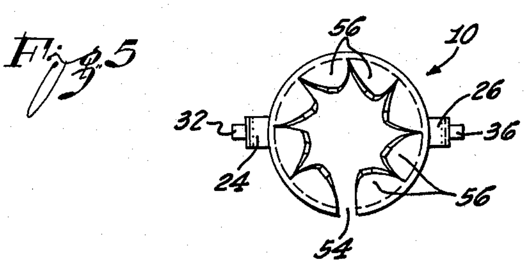
FIG. 5 is a top view of FIG. 4.

Referring to the modified embodiment shown in FIGS. 4 and 5, it will be apparent that the slotted cylindrical portion of receptacle 10, prongs or legs 24 and 26, and resilient tongues 32, 34, 36 and 38 are identical with the corresponding elements of the embodiment of FIGS. 1–3. The modification resides in the formation of small cooling fins in the bottom portion of the receptacle 10. Instead of the apertured bottom, the cylindrical receptacle wall continues into a number of protrusions 56 acting as cooling fins, eight such protrusions being shown in FIG. 5. It will be noted that the cooling fins are bent inwardly to form an angle of about 45 degrees with the bottom surface of a transistor when assembled with the receptacle, as indicated in FIG. 1. An increased total surface is thereby exposed to a flowing coolant, without sacrificing significant volume of valuable space.

The modified embodiment of FIGS. 4 and 5 is also suitably produced by punching out a sheet metal strip in the shape of the development of the cylinder including the legs, and also including the cooling fins in the form of an additional width suitably having a serrated edge. When shaping the cylindrical receptacle 10, with the slot 54 left open as described in connection with FIGS. 1–3, the protrusions 56 forming the cooling fins are bent into the position shown in FIGS. 4 and 5 by steps well known in the sheet metal art.

It is to be understood that the above-described arrangements are illustrative of the application of the principles of the invention. Numerous other arrangements may be devised by those skilled in the art without departing from the spirit and scope of the invention. Thus, by way of example and not of limitation, the openwork receptacle may be formed from wire mesh or a single helically wound wire may be used. One or more legs or prongs may be added to increase the stability, and the clips on the legs can be formed in any suitable manner. By way of example, the ends of each leg may be bent backward so that the free end of the leg forms one of the two tongues 34 and 38. Accordingly, from the foregoing remarks, it is to be understood that the present invention is to be limited only by the spirit and scope of the appended claims.

What is claimed is:

1. In a heat-dissipating component mounting, a cylindrical openwork receptacle adapted for removably receiving a transistor in intimate surface contact therewith, and a pair of spaced strip-shaped prongs secured to and extending parallel from said receptacle, each of said prongs having a pair of parallel longitudinally extending cuts interconnected by a centrally located cross-cut in a slender H-configuration to form a pair of resilient tongues bent away from the plane of the prong for resiliently engaging the edges around apertures in a mounting panel, said tongues being axially spaced from said receptacle, so that the receptacle protrudes completely into the space adjacent the panel to expose to the atmosphere in said space all of the free receptacle and transistor surfaces.

2. In a heat-dissipating component mounting, a cup-shaped, thin-walled receptacle having an aperture in the bottom and axial slots for resiliently and removably holding a transistor in intimate surface contact therewith, and a pair of parallel, spaced, strip-shaped prongs secured to and extending from said receptacle, each of said prongs having a pair of parallel longitudinally extending cuts interconnected by a centrally located cross-cut in a slender H-configuration to form a pair of resilient tongues bent away from the plane of the prong for resiliently engaging the edges around apertures in a mounting panel, the location of said prongs defining, upon assembly with said panel, the position of said receptacle with the transistor so that the receptacle protrudes completely into the space adjacent the panel to expose to the atmosphere in said space all of the free receptacle and transistor surfaces.

3. In combination, a printed circuit board, a transistor having at least one lead electrically connected to a conductor on said board, a cylindrical openwork receptacle removably enclosing said transistor in intimate surface contact therewith, and a pair of spaced strip-shaped prongs secured to and extending parallel from said receptacle, each of said prongs having a pair of parallel, longitudinally extending cuts interconnected by a centrally located cross-cut in a slender H-configuration to form a pair of resilient tongues bent away from the plane of the prong to form a pair of clips, said clips being axially spaced from said receptacle, said board having a pair of apertures receiving said clips so that the receptacle protrudes completely into the space adjacent said board to expose to the atmosphere in said space all of the free receptacle and transistor surfaces, said board having additional holes in the area between said pair of apertures for the transistor leads.

(References on following page)

References Cited by the Examiner

UNITED STATES PATENTS

| | | | |
|---|---|---|---|
| 2,100,042 | 11/1937 | Travis | 313—49 |
| 2,319,059 | 5/1943 | Hansman | 85—5 |
| 2,871,324 | 1/1959 | Budd | 317—234 |
| 2,876,399 | 3/1959 | Koenig | 317—234 |
| 2,917,286 | 12/1959 | Deakin | 317—234 |
| 2,964,688 | 12/1960 | McAdam | 317—234 |

JOHN W. HUCKERT, *Primary Examiner.*

DAVID J. GALVIN, *Examiner.*

J. A. ATKINS, J. D. KALLAM, *Assistant Examiners.*